METHOD OF FORMING ADHERENT MASKS ON OXIDE COATED SEMICONDUCTOR BODIES

Filed Feb. 11, 1966

INVENTOR.
ALLEN G. BAKER

BY David M. Keay

AGENT.

United States Patent Office 3,482,977
Patented Dec. 9, 1969

3,482,977

METHOD OF FORMING ADHERENT MASKS ON OXIDE COATED SEMICONDUCTOR BODIES

Allen G. Baker, Waltham, Mass., assignor to Sylvania Electric Products Inc., a corporation of Delaware Filed Feb. 11, 1966, Ser. No. 526,685
Int. Cl. G03c *5/00;* H01l *7/00*
U.S. Cl. 96—36.2 6 Claims

ABSTRACT OF THE DISCLOSURE

Method of treating the silicon oxide layer on a wafer of silicon by immersing the wafer in a solution of an organochlorosilane, such as dimethyldichlorosilane or diethyldichlorosilane, and then coating the treated silicon oxide surface with a photosensitive resistant masking material. The organochlorosilane reacts with the adsorbed OH groups at the silicon oxide surface to form a layer of a silicon polymer adherent to the surface to which the photosensitive resistant masking material forms a strong bond.

Figure 1:
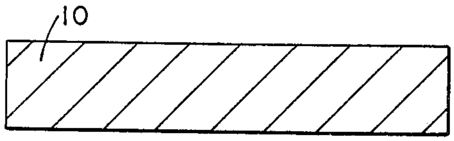
Figure 2:
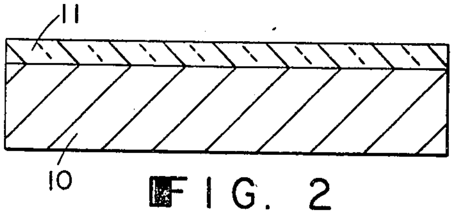
Figure 3:
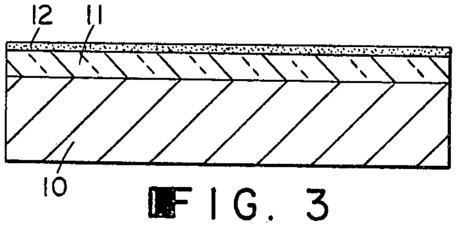
Figure 4:
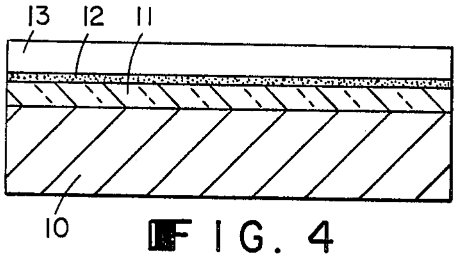
Figure 5:
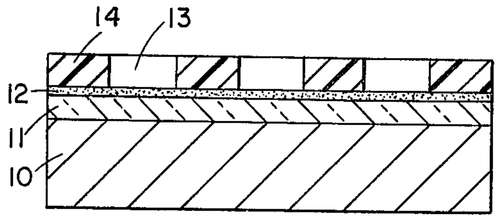

This invention relates to methods of forming an adherent layer of masking material on a contaminated surface. More particularly, it is concerned with methods of forming an adherent layer of a photosensitive resistant masking material on the surface of a body of semiconductor material covered with an adherent layer of silicon oxide.

In a well-known process of fabricating semiconductor devices and integrated circuit networks in a body of semiconductor material, conductivity type imparting materials are diffused into the body in succession through a series of patterns of openings in a layer of non-conductive silicon oxide adherent to the surface of the body of semiconductor material. In order to form the pattern of openings in the oxide layer for each diffusion step, the layer of oxide is coated with a photosensitive resistant masking material. The masking material is exposed to ultraviolet radiation through a mask having regions which are transparent to and regions which are opaque to ultraviolet radiation. The portions of the masking material exposed to the ultraviolet radiation are polymerized. The body of semiconductor material is then subjected to a suitable developing solution which washes away the portions of the masking material which were protected from the ultraviolet radiation by the opaque regions of the mask and, therefore, not polymerized. The underlying regions of the silicon oxide layer are thereby exposed.

The body of semiconductor material is then subjected to an etching solution which dissolves silicon oxide but does not attack silicon or the polymerized masking material. The exposed regions of the silicon oxide layer are dissolved, and the underlying surface areas of the semiconductor material of the body are exposed. The masking material is removed from the silicon oxide.

Then, the body of semiconductor material is placed in a diffusion furnace and subjected to an atmosphere including an appropriate conductivity type imparting material, for example boron which is a P-type conductivity imparting material or phosphorus which is an N-type conductivity imparting material. Conductivity type imparting material diffuses into the regions of the body of semiconductor material underlying the surface areas not coated by silicon oxide thereby altering the conductivity of the regions.

Since the configuration and spacing of the diffused regions are among the factors which determine the electrical characteristics of the final devices, it is important that th openings in the silicon oxide layer be defined precisely. In order for the openings in the silicon oxide layer to be defined precisely, the masking material on the surface of the oxide must be effective during the oxide etching procedure to protect all of the silicon oxide layer except the portions it is desired to remove. If the bond between the masking material and the silicon oxide is relatively weak to attack by the etching solution, the etching solution will spread along the silicon oxide-masking material interface and dissolve silicon oxide in an uncontrolled pattern.

The photosensitive resistant masking materials commonly employed in the semiconductor industry frequently do not bond to silicon oxide surfaces satisfactorily, and the etching solution undercuts the masking material. This problem occurs despite the use of standard cleaning procedures to remove physical contaminants from the surface of the oxide. Although some improvement in adhesion can be obtained by high temperature heating of the wafer prior to application of the masking material, this procedure tends to alter the electrical characteristics of the devices.

It is an object of the present invention, therefore, to provide a method of forming a layer of masking material on a surface so as to obtain improved adherence of the masking material to the surface.

It is also an object of the invention to provide an improved method of forming an adherent layer of photosensitive resistant masking material on a body of semiconductor material covered with an adherent layer of silicon oxide.

It is a further object of the invention to provide an improved method of removing portions of a layer of silicon oxide from the surface of a body of semiconductor material covered with an adherent layer of silicon oxide.

In accordance with the foregoing objects of the invention it has been discovered that by subjecting the surface of a body to treatment with an organochlorosilane, and then coating the treated surface with a masking material, improved adherence of the masking material to the surface is obtained.

Additional objects, features, and advantages of the invention will be apparent from the following more detailed description and the accompanying drawings wherein FIGS. 1 through 8 are elevational views in cross-section representing a wafer of semiconductor material at various stages during processing in accordance with the method of the invention.

As illustrated in the figure of the drawing the method of the invention is carried out on a wafer of a semiconductor material 10, such as for example silicon, which has been covered with an adherent layer of silicon oxide 11 as by heating the body of silicon in a wet oxygen atmosphere. Depending upon the previous processing history of the wafer, the wafer may be chemically cleaned, rinsed, and dried to remove physical contaminants from the surface of the silicon oxide.

In accordance with the invention, the silicon wafer is immersed in a solution of an organochlorosilane in an organic solvent, such as, for example, a solution of a methylchlorosilane in trichloroethylene. Although the concentration of the solution is not considered critical, it has been found most practical to employ a solution having between 1 and 10% of the organochlorosilane by weight. After being soaked in the solution, the wafer is rinsed in the organic solvent, dried, and heated.

Figure 6:
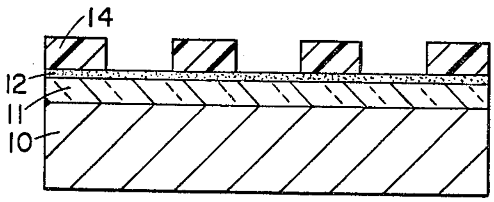
Figure 7:
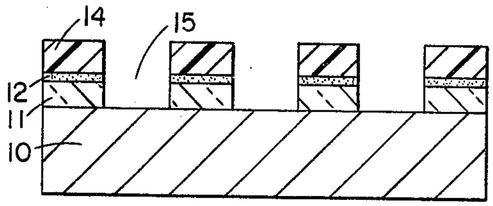
Figure 8:
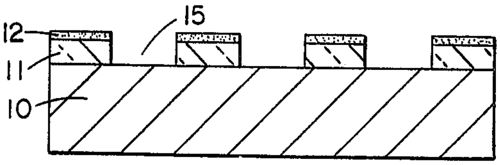

A photosensitive resistant masking material 13 of any of the various types commonly employed in the semiconductor industry is applied to the treated surface 12 of the silicon oxide 11 in the usual manner and dried. The masking material 13 is exposed to ultraviolet light through a mask having regions which are transparent to and regions which are opaque to ultraviolet light. The ultraviolet light polymerizes the portions 14 of the photosensitive masking material underlying the transparent regions of the mask. The wafer is sprayed with a suitable developing solution to wash away the portions 13 of the masking material which were shielded from the ultraviolet light by the opaque regions of the mask. The wafer is heated to further polymerize and harden the remaining masking material 14. Then the masked wafer, as illustrated in FIG. 6, is immersed in a suitable etching solution, typically a hydrofluoric acid solution, which dissolves silicon oxide but does not attack silicon or the masking material in order to remove the exposed silicon oxide and expose the underlying surface areas of the silicon, as illustrated in FIG. 7. The remaining masking material is removed by dissolving in a suitable solvent. The resulting wafer is illustrated in FIG. 8.

It is believed that the organochlorosilane reacts with OH groups adsorbed to the silicon oxide surface to produce a silicone polymer linked with the silicon oxide. The surface has become contaminated with the OH groups because of exposure of the silicon wafer to water vapor. It is believed that the organochlorosilane, dimethyldichlorosilane for example, reacts with OH groups adsorbed to silicon atoms at the surface of the silicon oxide layer to produce hydrochloric acid and link the adsorbed silicone molecules to the free oxygen atoms. In order for this reaction to occur, the organochlorosilane employed may contain 1, 2, or 3 chlorine atoms together with 3, 2, or 1 organic groups, respectively, linked to each silicon atom. Rinsing the wafer surface in the organic solvent and heating the wafer drives off the hydrochloric acid and removes excess material to leave substantially a monolayer 12 of a silicone polymer chemically bonded to the silicon oxide layer 11 and terminated with non-polar organic groups outermost.

The photosensitive resistant masking material 13 must be capable of wetting the treated surface in its liquid form as applied to the surface and must adhere to the surface upon drying. The organic groups, for example methyl groups, provide for a relatively strong bond to be maintained between the treated surface and the polymerized masking material 14 when the wafer is subjected to a hydrofluoric acid etching solution. Therefore, the masking material is not undercut and the configuration of the openings 15 formed in the oxide layer 11 may be controlled precisely.

Heretofore the surface of the silicon oxide remained terminated with adsorbed OH groups outermost. These groups formed a bond between the surface of the silicon oxide layer and the polymerized masking material which was relatively weak in the presence of a hydrofluoric acid etching solution. Therefore, the etching solution attacked the interface whereever the OH groups were present causing the masking material to be undercut and portions of the silicon oxide layer underlying the masking material to be dissolved.

It has been found that when the silicon wafer previously has been subjected to a diffusion process, improved adhesion of masking material may be obtained by leaching contaminants out of a thin surface layer of the silicon oxide layer and then treating the wafer in an organochlorosilane. During the diffusion process phosphorus, in particular, together with other materials in the diffusion atmosphere react with the silicon oxide to produce a so-called glassy coating at the surface of the silicon oxide.

The wafer may be treated to leach out the phosphorus and other contaminants to a depth of a few angstrom units below the surface by immersing the wafer in hot concentrated sulfuric acid. The temperature of the acid may be between 220° C. and 320° C. depending upon the degree of contamination of the silicon oxide layer. After being leached in the sulfuric acid, the wafer is rinsed in water and dried.

After this treatment, it is found that substantially the entire surface is terminated with adsorbed OH groups outermost. Thus, a very poor bond would be obtained between the masking material and the wafer if the masking material were applied directly on this surface. However, as explained hereinabove excellent adhesion of the masking material can be obtained by treating the surface terminated with OH groups with an organochlorosilane prior to application of the masking material.

The following are specific examples illustrating the use of the method of the invention.

Example 1

A wafer of silicon which had been heated in a wet oxygen atmosphere to form a surface layer of silicon oxide was immersed for about 1 minute in a 2% solution by weight of dimethyldichlorosilane dissolved in trichloroethylene. The wafer was removed from the solution, soaked in trichloroethylene for about 1 minute, and then dried by spinning. The wafer was placed in an oven and baked at a temperature of 180° for 5 minutes.

Next, a coating of masking material was applied to the treated surface of the wafer by spinning. The wafer in the semiconductor art. A solution of a photosensitive resistant masking material sold under the trade name KTFR by Eastman Kodak Company of Rochester, N.Y., mixed with a thinner sold under the trade name KMER Thinner by Eastman Kodak Company was applied to the treated surface of the wafer by spinning. The wafer was baked in an oven at 80° C. for 5 minutes to drive off the thinner and harden the resistant masking material.

The layer of photosensiitve resistant masking material on the treated surface of the wafer was exposed to ultraviolet light through a mask having some regions which were opaque to ultraviolet light and some regions which were transparent to ultraviolet light. A developing solution sold under the trade name KMER Developer by Eastman Kodak Company was sprayed on the photosensitive resistant masking material to rinse away the portions of the masking material not polymerized by ultraviolet light passing through the transparent regions of the mask. The wafer was baked at one temperature of 150° C. for 30 minutes to further polymerize and harden the remaining resistant masking material.

The masked wafer was then etched in a buffered hydrofluoric acid solution of 600 milliliters of water, 400 grams of ammonium fluoride, and 90 milliliters of 48% hydrofluoric acid aqueous solution. The wafer was immersed in the etching solution for about 15 minutes in order to dissolve away the exposed portions of the silicon oxide layer which was approximately 10,000 angstrom units thick.

Following the etching step, the resistant masking materail was dissolved by immersing the wafer in concentrated sulfuric acid at a temperature of 150° C. for 1 minute. The wafer was rinsed in water for 5 minutes and then dried.

Example 2

A wafer of silicon having a surface covered with silicon oxide previously had been treated in a diffusion furnace to diffuse phosphorus into regions of the wafer. In order to leach out the phosphorus at the surface of the oxide layer the wafer was immersed in concentrated sulfuric acid at a temperature of about 250° C. for 5 minutes. Then the wafer was rinsed in water and dried.

The wafer was immersed for 1 minute in a 5% solution by weight of diethyldichlorosilane dissolved in trichloroethylene. The wafer was soaked in trichloroethylene for 1 minute and then spin dried. The wafer was baked at 180° C. for 5 minutes. Then a layer of KTFR photosensitive resistant masking material was applied to the treated surface and the wafer otherwise processed as described in Example 1 to expose predetermined surface areas of the silicon.

Example 3

A silicon wafer covered with an adherent layer of silicon oxide was immersed for 1 minute in a 10% solution by weight of dimethyldichlorosilane dissolved in acetone. The wafer was then immersed in acetone for 1 minute, spin dried, and heated at a temperature of 180° C. for 5 minutes. A coating of KTFR masking material was applied, exposed to ultraviolet light, and the wafer etched in a buffered hydrofluoric acid solution as described in Example 1.

Example 4

A silicon wafer covered with an adherent layer of silicon oxide was immersed for ½ minute in a 1% solution by weight of dimethyldichlorosilane dissolved in trichloroethylene. The wafer was soaked in trichloroethylene for 1 minute, spin dried, and baked at a temperature of 180° C. for 5 minutes. The treated wafer was further processed by applying KTFR photosensitive resistant masking material, exposing to ultraviolent light, and etching away the exposed silicon oxide as described in Example 1.

Silicon wafers processed according to the foregoing examples had openings in the silicon oxide coating which were of desired configuration and spacing. The interface between the treated surface of the silicon oxide layer and the resistant masking material contained no contaminants susceptible to severe action by the hydrofluoric acid etching solution. Thus, the etching solution did not loosen the bond sufficiently to cause noticeable undercutting of the masking material.

While there has been shown and described what are considered preferred embodiments of the present invention, it will be obvious to those skilled in the art that various changes and modifications may be made therein wi.hout departing from the invention as defined in the appended claims.

What is claimed is:

1. The method of forming an adherent layer of masking material on a surface of a body of semiconductor material covered with an adherent layer of silicon oxide having OH groups adsorbed to the surface of the silicon oxide including the steps of contacting the surface of the layer of silicon oxide with an organochlorosilane, and coating the treated surface with a layer of masking material capable of wetting the treated surface and capable of adhering to the treated surface when dried.

2. The method of forming an adherent layer of masking material on a surface of a body of semiconductor material covered with an adherent layer of silicon oxide having OH groups adsorbed to the surface of the silicon oxide according to claim 1 in which the step of contacting the surface of the layer of silicon oxide with an organochlorosilane comprises immersing the body of semiconductor material in a solution of dimethyldichlorosilane in an organic solvent.

3. The method of forming an adherent layer of masking material on a surface of a body of semiconductor material covered with an adherent layer of silicon oxide having OH groups adsorbed to the surface of the silicon oxide according to claim 1 in which the step of contacting the surface of the layer of silicon oxide with an organochlorosilane comprises immersing the body of semiconductor material in a solution of diethyldichlorosilane in an organic solvent.

4. The method of forming an adherent layer of masking material on a surface of a body of semiconductor material covered with an adherent layer of silicon oxide having OH groups adsorbed to the surface of the silicon oxide according to claim 1 in which a conductivity type imparting material previously has been diffused into the body of semiconductor material, and including the step of subjecting the surface of the layer of silicon oxide to hot concentrated sulfuric acid to leach contaminants from the surface prior to the step of contacting the surface of the layer of silicon oxide with an organochlorosilane.

5. The method of removing portions of a layer of silicon oxide from the surface of a body of semiconductor material covered with an adherent layer of silicon oxide having OH groups adsorbed to the surface of the silicon oxide including the steps of immersing the body of semiconductor material in a solution containing about 1% to 10% by weight of dimethyldichlorosilane in an organic solvent to form a layer of a silicone polymer adherent to the surface of the layer of silicon oxide and having methyl groups outermost, rinsing the body of semiconductor material in the organic solvent, heating the body of semiconductor material to drive off material in excess of a monolayer of methyl terminated silicone polymer adherent to the surface of the silicon oxide, applying to the treated surface a layer of a photosensitive resistant masking material capable of wetting the treated surface and capable of adhering to the treated surface when dried, drying the layer of photosensitive resistant masking material, subjecting portions of the layer of photosensitive resistant masking material to radiation to polymerize said portions, rinsing the body of semiconductor material in a developing solution which washes away only the portions of the layer of photosensitive resistant masking material not subjected to radiation to expose the underlying portions of the treated surface, contacting the surface with a buffered hydrofluoric acid solution to dissolve the exposed silicon oxide and expose the underlying semiconductor material of the body, and subsequently removing the remaining portions of the resistant masking material.

6. The method of removing portions of a layer of silicon oxide from the surface of a body of semiconductor material covered with an adherent layer of silicon oxide having OH groups adsorbed to the surface of the silicon oxide according to claim 5 in which phosphorus previously has been diffused into the body of semiconductor material, and including the steps of immersing the body of semiconductor material in concentrated sulfuric acid at a temperature between 220° C. and 320° C. to leach contaminants from the surface, and rinsing the body of semiconductor material in water prior to the step of immersing the body of semiconductor material in the solution of dimethyldichlorosilane in an organic solvent.

References Cited

UNITED STATES PATENTS

| | | | |
|---|---|---|---|
| 3,135,638 | 6/1964 | Cheney et al. | 156—11 |

OTHER REFERENCES

Multilayer Resists, Htoo, IBM Technical Disclosure Bulletin, vol. 10, No. 5, Oct. 5, 1967, p. 536.

JACOB H. STEINBERG, Primary Examiner

U.S. Cl. X.R.

96—36; 117—12, 5.5, 123; 156—11, 17